United States Patent
Homma et al.

(10) Patent No.: US 9,646,908 B2
(45) Date of Patent: May 9, 2017

(54) METHOD FOR MANUFACTURING SEMICONDUCTOR DEVICE AND SEMICONDUCTOR DEVICE

(71) Applicant: KABUSHIKI KAISHA TOSHIBA, Tokyo (JP)

(72) Inventors: Soichi Homma, Yokkaichi Mie (JP); Masaya Shima, Oita Oita (JP); Yuusuke Takano, Yokkaichi Mie (JP); Takeshi Watanabe, Yokkaichi Mie (JP); Katsunori Shibuya, Mie-gun Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/217,599

(22) Filed: Jul. 22, 2016

(65) Prior Publication Data

US 2017/0025321 A1 Jan. 26, 2017

(30) Foreign Application Priority Data

Jul. 23, 2015 (JP) .................................. 2015-145612

(51) Int. Cl.
*H01L 23/28* (2006.01)
*H01L 23/31* (2006.01)
(Continued)

(52) U.S. Cl.
CPC ...... *H01L 23/3142* (2013.01); *H01L 21/4828* (2013.01); *H01L 21/52* (2013.01); *H01L 21/565* (2013.01); *H01L 21/78* (2013.01); *H01L 23/49541* (2013.01); *H01L 23/49575* (2013.01); *H01L 25/0657* (2013.01);
(Continued)

(58) Field of Classification Search
CPC .......... H01L 23/3142; H01L 23/49541; H01L 23/49575; H01L 25/0657; H01L 21/4824; H01L 21/565; H01L 21/78; H01L 21/52
See application file for complete search history.

(56) References Cited

U.S. PATENT DOCUMENTS 8,929,092 B2  1/2015  Yoshioka et al.
9,082,635 B2  7/2015  Yoshioka et al.

FOREIGN PATENT DOCUMENTS

JP   H07188915 A   7/1995
JP   2006202835 A  8/2006
(Continued)

*Primary Examiner* — Long Pham
(74) *Attorney, Agent, or Firm* — Patterson & Sheridan, LLP (57) ABSTRACT

In a method for manufacturing a semiconductor device, a resin layer including an inorganic filler is molded on a surface of a substrate which includes semiconductor elements attached thereto by an adhesive, and terminals electrically connected to the semiconductor elements on another surface thereof. The molded substrate is cut so as to expose a conductive body electrically connected to an external terminal maintainable at ground potential. The surface of the resin layer of the substrate is sputter-etched in a vacuum environment, in a state where a plurality of the cut substrates is provided in a tray so that the surface of the substrate faces the tray. A metal layer is sputtered so as to be electrically connected to the conductive body on the surface and the cut surface in a state where the substrate is provided in the tray while maintaining the vacuum environment after sputter-etching.

7 Claims, 4 Drawing Sheets (51) Int. Cl.
*H01L 23/495* (2006.01)
*H01L 25/065* (2006.01)
*H01L 21/48* (2006.01)
*H01L 21/56* (2006.01)
*H01L 21/78* (2006.01)
*H01L 21/52* (2006.01)

(52) U.S. Cl.
CPC ............... *H01L 2225/06527* (2013.01); *H01L 2225/06555* (2013.01); *H01L 2225/06572* (2013.01)

(56) References Cited

FOREIGN PATENT DOCUMENTS

| | | |
|---|---|---|
| JP | 2007332408 A | 12/2007 |
| JP | 2011100778 A | 5/2011 |
| JP | 2011243790 A | 12/2011 |
| JP | 2012038765 A | 2/2012 |
| JP | 2013149810 A | 8/2013 |
| JP | 2013221176 A | 10/2013 |
| JP | 2014056944 A | 3/2014 |

| | short | | Etching duration time [s] | | | long |
|---|---|---|---|---|---|---|
| CONDITIONS | a | b | c | d | e | f |
| RESULT OF PEELING TEST | × | ○ | ○ | ○ | ○ | × |
| RATIO OF SI OF SURFACE OF SEALING LAYER | 4.4% | 18.5% | — | 21.1% | 24.5% | 30.3% |

FIG. 10

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2015-145612, filed Jul. 23, 2015, the entire contents of which are incorporated herein by reference.

FIELD

Embodiments described herein relate generally to a method for manufacturing a semiconductor device and a semiconductor device.

BACKGROUND

A semiconductor chip is supplied as a semiconductor package in some cases.

DETAILED DESCRIPTION

According to an embodiment a semiconductor device is easily manufactured.

According to one embodiment, a method for manufacturing a semiconductor device includes molding a sealing resin layer, including: an inorganic filler therein, on a surface of a substrate which includes a plurality of semiconductor elements attached thereto by an adhesive, the substrate further including external input and output terminals disposed on another surface thereof electrically connected to the semiconductor elements; cutting the molded substrate so as to expose a conductive body therein having a terminal portion electrically connectable to an external input and output terminal; positioning the cut molded substrates in a tray such that a surface of the sealing resin layer is exposed and an opposed surface of the cut molded substrate faces a surface of the tray; sputter-etching, in a sub-atmospheric pressure environment, the exposed surface of the sealing resin layer; and sputtering a metal layer over the sealing resin layer and the cut portion of the molded substrate in a sub-atmospheric pressure environment to electrically connect the metal layer to the conductive body on the surface of the cut surface while the cut molded substrate is located on the tray. During the sputter-etching, at least a portion of the inorganic filler in the sealing resin is exposed.

Hereinafter, embodiments will be described with reference to the drawings. In the following description, substantially the same components having the same function are denoted by the same reference numerals.

A semiconductor device 100 and a method for manufacturing the same will be described with reference to FIGS. 1 to 8. Note that, the semiconductor device 100 in the state it has as it is formed in each manufacturing step is referred to as 100a, 100b, and 100c in the following description.

Figure 1:
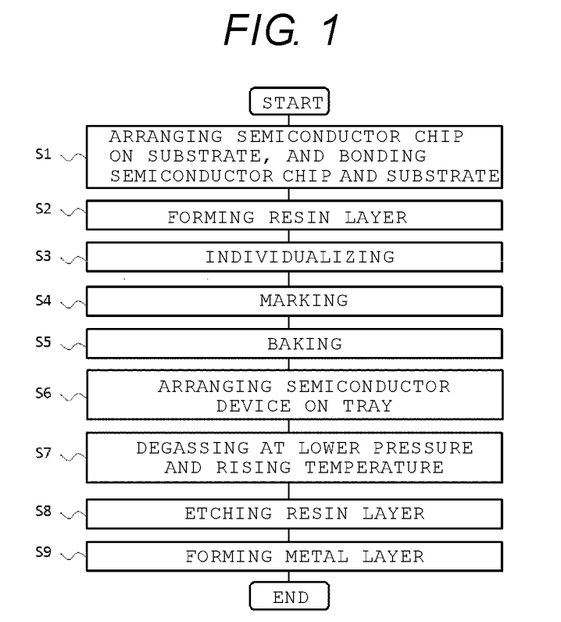
FIG. 1 is a flow chart illustrating a method for manufacturing a semiconductor device according to the embodiment.

FIG. 1 is a flow chart schematically illustrating the manufacturing steps of the semiconductor device 100. The manufacturing steps of the semiconductor device 100 will be described below with reference to the flow chart of FIG. 1.

Figure 2:
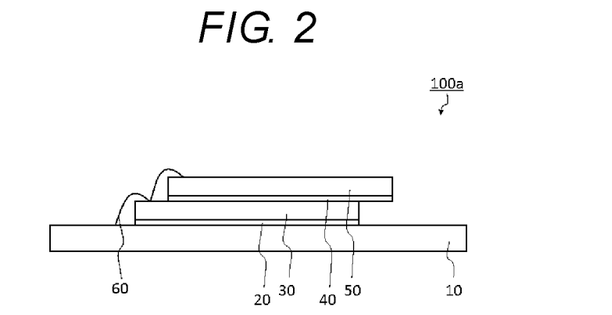
FIG. 2 is a schematic sectional view showing a plurality of semiconductor chips bonded to a substrate and connected by a wire used the method for manufacturing the semiconductor device according to the embodiment.

In Step S1, as illustrated in FIG. 2, a first semiconductor chip 30 is provided on one surface of a wiring substrate 10 with an adhesive layer 20 therebetween. A second semiconductor chip 50 is provided on the first semiconductor chip 30 with a second adhesive layer 40 therebetween. A bonding wire 60 is electrically connected between the wiring substrate 10 and the first semiconductor chip 30, and is also connected to the second semiconductor chip 50. A semiconductor device 100a is formed in Step S1.

The wiring substrate 10 is an insulating resin wiring substrate or a ceramic wiring substrate which is provided with, for example, surfaces (one surface and another surface which is opposite to the one surface) and a wiring layer (not shown) therein. Specifically, a printed wiring board using a glass epoxy resin is used as the wiring substrate 10, for example. A pad, electrically connected between the first and second semiconductor chips 30, 50 and the wiring layer, is provided on one surface of the wiring substrate 10 (for example, a pad 10-1 in FIG. 8). The wiring layer of the surface of the wiring substrate 10 includes a ground wiring (for example, wiring 10-1g in FIG. 8) that may be maintained at ground potential during operation of the semiconductor device. The wiring layer within the wiring substrate 10 includes a ground wiring (for example, wiring 10-4g in FIG. 8) that may be at ground potential during operation of the semiconductor device. An external connecting terminal (for example, wiring 10-1b in FIG. 8) is provided on the other surface of the wiring substrate 10. Glass epoxy resin layers (for example, glass epoxy resin layers 10-2a and 10-2b in FIG. 8) are provided between the wiring layer of the surface and the wiring layer within the wiring substrate 10. A portion of the wiring layer of the one surface of the wiring substrate 10 is covered with solder resist layers (for example, solder resist layers 10-3a and 10-3b in FIG. 8).

The first adhesive layer 20 and the second adhesive layer 40 are, for example, a die attach film (DAF). The first semiconductor chip 30 and the second semiconductor chip 50 are an arbitrary semiconductor chip such as a semiconductor memory chip and a semiconductor memory controller. The bonding wire 60 is a metal wire such as an Au wire, a Cu wire, an Ag wire, and a Pd-coated Cu wire. The first adhesive layer 20 and the second adhesive layer 40 are respectively provided on the rear surfaces of the first semiconductor chip 30 and the second semiconductor chip 50 before the wafers on which they reside are singulated into individual chips. The wafers are diced with the first adhesive layer 20 and the second adhesive layer 40 thereon. The first semiconductor chip 30 and the second semiconductor chip 50 in which the first adhesive layer 20 and the second adhesive layer 40 are respectively provided in advance are mounted onto the wiring substrate 10. In a case of using a liquid-type die attachment material in the first adhesive layer 20 and the second adhesive layer 40, the first adhesive layer 20 and the second adhesive layer 40 are provided in advance on the wiring substrate 10 side of the semiconductor chips, and then the diced first semiconductor chip 30 and second semiconductor chip 50 are mounted on the wiring substrate thereafter.

After mounting the first semiconductor chip 30 and the second semiconductor chip 50, the wiring substrate 10 is heated in an oven, and is then plasma cleaned. For the plasma cleaning, Ar gas, $O_2$ gas, $H_2$ gas, or a combination of these gases is used, for example. The plasma cleaned wiring substrate 10, and the first semiconductor chip 30 and the second semiconductor chip 50 are electrically connected to each other by the bonding wire 60.

Note that although FIG. 2 illustrates one semiconductor device 100a, additional semiconductor devices are arranged in a direction orthogonal to a paper surface in FIG. 2 or a horizontal direction of the paper surface, and the first semiconductor chip 30 and the second semiconductor chip 50 are provided on a wiring substrate 10 which includes a plurality of semiconductor devices 100 mounted thereon.

Figure 3:
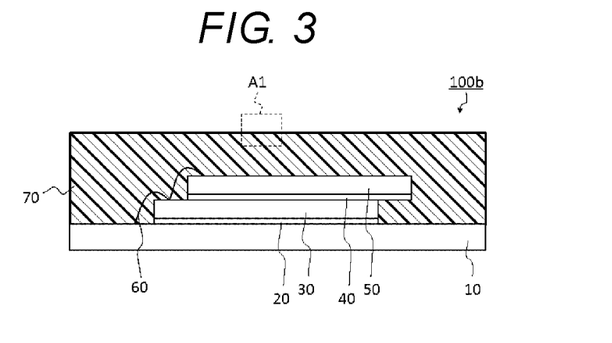
FIG. 3 is a schematic sectional view showing the structure of FIG. 2 encased in a resin.

In Step S2, as illustrated in FIG. 3, a sealing layer 70 is provided on the wiring substrate 10 to integrally seal the first semiconductor chip 30, the second semiconductor chip 50, and the bonding wire 60 therein. The semiconductor device 100b is thus formed at Step S2.

The sealing layer 70 is formed by putting the connected body of the plurality of semiconductor devices 100a on the wiring substrate 10 into a mold, allowing a resin to flow into the mold, and then curing the resin. Accordingly, in the semiconductor device 100b, the sealing layer 70 is provided in a state where the plurality of semiconductor devices 100b is connected to the wiring substrate 10. In addition, the sealing layer 70 may be formed by allowing the resin to flow into the mold first, then introducing the plurality of semiconductor devices 5 on the wiring substrate 10 into the mold, and then curing the resin. Further, the plasma cleaning may be performed before forming the sealing layer 70. For the plasma cleaning, Ar gas, $O_2$ gas, $H_2$ gas, or a combination of these gases are used, for example.

In addition, when the sealing layer 70 is formed using the above-described mold, a releasing agent is used so that the semiconductor device 100a is easily detached from the mold. In this case, releasing agent remains attached to the surface of the sealing layer 70.

The sealing layer 70 will be specifically described with reference to FIG. 4.

Figure 4:
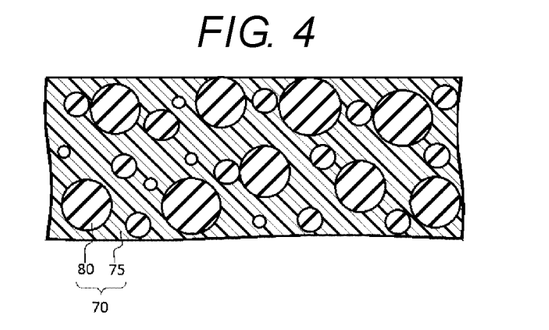
FIG. 4 is an enlarge view of an area A1 of the structure of FIG. 2 encased in the resin of FIG. 3.

FIG. 4 is a sectional view of area A1 of FIG. 3. As illustrated in FIG. 4, the sealing layer 70 includes a resin 75 and an inorganic filler 80. The inorganic filler 80 is arranged inside the resin 75.

The resin 75 is a thermosetting resin, and examples thereof include an epoxy resin and an acryl resin.

The inorganic filler 80 is, for example, particles of silica, that is, silicon oxide. In addition to silica, examples of the inorganic filler 80 may include particles of aluminum hydroxide, calcium carbonate, aluminum oxide, boron nitride, titanium oxide, and barium titanate.

By adding the inorganic filler 80 to the sealing layer 70, the heat resistance of the sealing layer 70 is improved while the hygroscopicity thereof is reduced, and thus the reliability of the semiconductor device 100 is improved. Further, the elasticity of the sealing layer 70 is improved, and thus it is possible to prevent the semiconductor device 100 from being deformed.

In Step S3, the connected body of the plurality of semiconductor devices 100b is divided into individual semiconductor devices 100b using a blade. The dividing is performed by cutting the connected body with the blade while cooling the blade and the semiconductor device 100b with carbonated water or pure water, for example.

In Step S4, marking is performed on the semiconductor device 100b. The marking is performed by engraving a product name, a manufacturer, a lot number, and the like using a laser marker. The marking is engraved in a portion of the surface of the sealing layer 70 which forms unevenness in the surface thereof.

In Step S5, the semiconductor device 100b is placed in an oven and heated (baked). The baking is performed at a temperature from 100° C. to 260° C. Because carbonated water or pure water is used in Step S3, the semiconductor device 100b contains a large amount of moisture. Thus, the moisture contained, for example, in the resin layer 75 of the semiconductor device 100b is degassed, i.e., evaporated therefrom, by baking the semiconductor device 100b at a temperature which is equal to or higher than 100° C., and thus the adhesion of a metal layer (described below) thereto can be improved. In addition, by baking the semiconductor device 100b at a temperature which is equal to or lower than the reflow temperature of solder, for example, at a temperature which is equal to or lower than 260° C., or is preferably equal to or lower than 230° C., it is possible to prevent the reliability of a wiring or a transistor included in the semiconductor device 100b from being deteriorated. In addition, when the semiconductor memory chip is included in the semiconductor device 100b, it is possible to prevent the reliability of the semiconductor memory from being deteriorated by avoiding a thermal load due to the high temperature.

Figure 5:
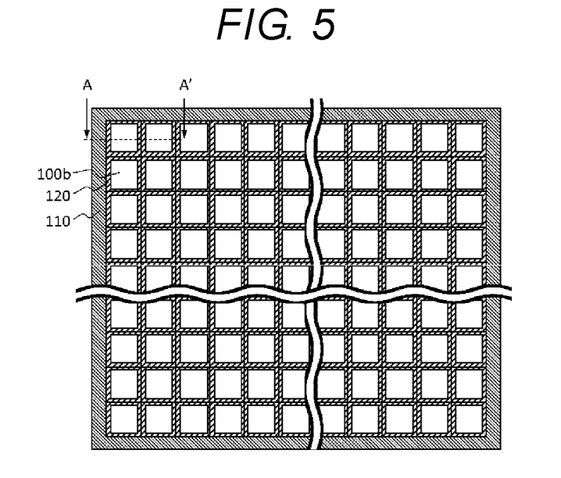
FIG. 5 is a schematic plan view illustrating the upper surface of a tray used in the method for manufacturing the semiconductor device according to the embodiment.
Figure 6:
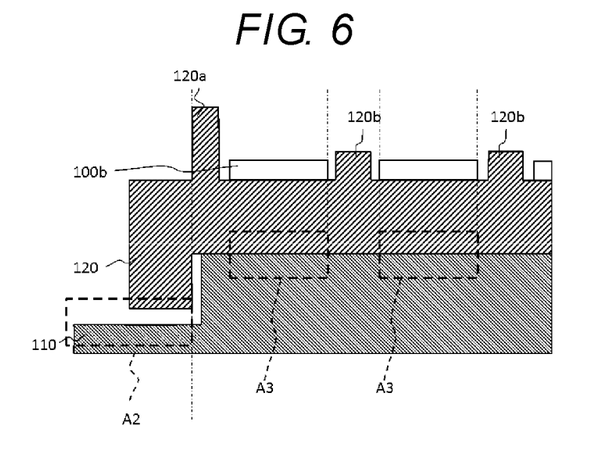
FIG. 6 is a sectional view of the tray of FIG. 5 taken along line AA' in FIG. 5.

In Step S6, the semiconductor device 100b is provided on a tray 120 as illustrated in FIGS. 5 and 6. The tray 120 is partitioned by a partition area 120a and a partition area 120b which are formed into a substantially rectangular shape. The semiconductor device 100b is arranged between the partition areas in a recess having the substantially rectangular shape of the tray 120. Meanwhile, the partition area 120a is provided on the outermost of the area on which the semiconductor device 100b is arranged. The partition area 120b is provided between the semiconductor devices 100b. In addition, FIG. 6 illustrates that the partition areas 120a and 120b project upwards from the surface of the tray 120 on which the semiconductor device 100b is stacked; however, the shapes of the partition areas 120a and 120b are not limited to this configuration. The partition areas 120a and 120b may be formed into a recessed portion, or any other shape. The material of the tray 120 may include aluminum, copper, stainless steel, iron, nickel, chromium, titanium, and an alloy or a composite material thereof.

The tray 120 is placed on a carrier 110 after the semiconductor device 100b is placed in the region having the substantially rectangular shape. The material of the carrier 110 may include aluminum, copper, stainless steel, iron, nickel, chromium, titanium, and an alloy or a composite material thereof.

An area A2 as illustrated in FIG. 6 is provided on the tray 120 and extends outwardly from the external side of the partition area 120a, and it includes an area in which the height or thickness of the carrier 110 is different from that in an area A3 described below. The area A3 is an area overlapping with the location of the semiconductor device 100b in a plan view, and where the thickness of the tray 120 is greater than that of the area A2. As illustrated in FIG. 6, the entirety of the area overlapping with the location of semiconductor device 100b may be the area A3.

The tray 120 and the carrier 110 are arranged in the area A2 without coming in contact with each other. In addition, the tray 120 and the carrier 110 are arranged in area A3 in contact with each other. In other words, the difference of thickness between the area A2 and the area A3 with respect to the carrier 110 is smaller than the difference of height between the area A2 and the area A3 with respect to the tray 120.

Since the tray 120 and the carrier 110 are arranged in the area A3 in a state of contact with each other, it is possible to easily transfer heat from the semiconductor device 100b. Specifically, when forming a metal layer according to a sputtering method in Step S9 described below, it is possible to suppress the temperature rise of the semiconductor device 100b.

In addition, the difference in the thickness of the carrier 110 between the area A2 and the area A3 is smaller than the difference in the thickness of the tray 120 between the area A2 and the area A3. In this configuration, the tray 120 and the carrier 110 easily come in contact within the area A3.

In Step S7, the semiconductor device 100b is introduced together with the tray 120 and the carrier 110 into a chamber held at sub-atmospheric pressure. The semiconductor device 100b is baked in a first chamber. The semiconductor device 100b is heated, for example, to a temperature from 150° C. to 260° C., and is preferably heated to a temperature which is equal to or lower than 230° C.

Since the semiconductor device 100b is heated in a sub-atmospheric pressure chamber, it is possible to evaporate the moisture which is absorbed into the sealing layer 70 after the baking step S5. Further, in Step S7, the semiconductor device 100b is heated in the sub-atmospheric pressure chamber, and thus it is possible to further evaporate the moisture which is absorbed into the sealing layer 70. By removing the moisture, it is possible to improve the adhesion between the metal layer (described below) and the sealing layer 70.

After Step S7, the semiconductor device 100b is transferred, together with the tray 120 and the carrier 110, into an etching chamber. During this transfer, the semiconductor device 100b is not exposed to the atmosphere. That is, the processing in Step S5 and Step S6 is sequentially performed without breaking vacuum. Specifically, for example, the sub-atmospheric pressure chamber and the etching chamber are provided in the same apparatus. Then, the semiconductor device 100b is introduced into the etching chamber without being exposed to the exterior of the apparatus. Alternatively, the sub-atmospheric pressure chamber and the etching chamber may be the same chamber.

In Step S8, the semiconductor device 100b is etched in the etching chamber. The semiconductor device 100b is etched (sputter-etching) by a plasma containing, for example, argon (Ar) and nitrogen (N). The flow rate ratio of argon to nitrogen can be set to be 3:7 to 7:3, for example. When the etching is performed with the flow rate ratio of argon to nitrogen which extends beyond the above range, the adhesion between the sealing layer 70 and the metal layer described below may be deteriorated. By this etching, the surface of the resin 75 of the sealing layer 70 of the semiconductor device 100b is etched away in a range of from 1 nm to 100 nm. That is, the etching is performed under the condition that the etching speed of the resin 75 is faster than that of the inorganic filler 80.

Figure 7A:
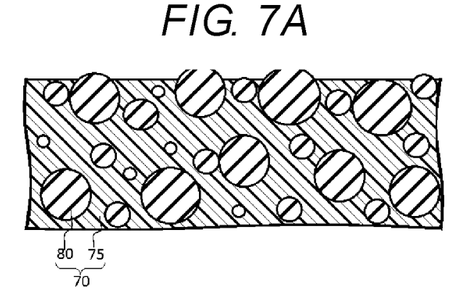
FIGS. 7A and 7B are schematic sectional views of the surface of the resin used in the method for manufacturing the semiconductor device according to the embodiment.
Figure 7B:
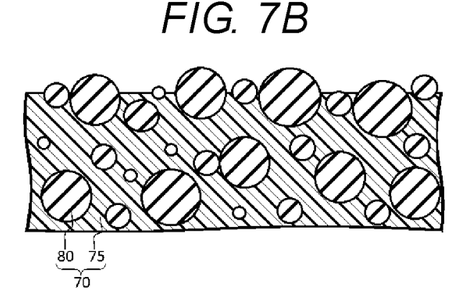

FIGS. 7A and 7B are schematic sectional views after etching an area A1 of the sealing layer 70 in FIG. 3. FIG. 7B illustrates a case where an etching amount is greater than that in FIG. 7A.

As illustrated in FIGS. 7A and 7B, when the semiconductor device 100b is etched, the resin at the exposed surface of the resin 75 is removed by the etching. When the resin is removed by etching, particles of the inorganic filler 80 are exposed, and unevenness is created on the surface of the sealing layer 70 as the inorganic filler particles 80 protrude from the etched surface of the resin 75. Due to this unevenness, the adhesion between the sealing layer 70 and the metal layer described below is improved. In addition, the adhesion between the inorganic filler 80 and the metal layer, and the adhesion between the resin 75 and the metal layer is satisfactory, and thus the adhesion between the sealing layer 70 and the metal layer is improved.

In addition, as illustrated in 7B, when the etching amount is increased, a larger amount of resin 75 is etched away. That is, the inorganic filler 80 is further exposed at, and protrudes further from, the surface of the sealing layer 70. That is, as the unevenness of the surface of the sealing layer 70 becomes larger, the exposure of the inorganic filler 80 is increased, and thus the adhesion between the surface of the sealing layer 70 and the metal layer is further improved.

In addition, when release agent is attached to the surface of the sealing layer 70 during the forming of the sealing layer 70, the release agent is etched away together with the surface of the resin 75 by the above-described etching, and thus the amount of release agent on the surface of the sealing layer 70 is reduced. That is, the adhesion between the sealing layer 70 and the metal layer is further improved.

After Step S8, the semiconductor device 100b is transferred, together with the tray 120 and the carrier 110, into a film forming chamber. In this case, the semiconductor device 100b is not exposed to the atmosphere. That is, the processing in Step S6 and Step S7 is sequentially performed without breaking vacuum. Specifically, for example, the etching chamber and the forming film chamber are provided in the same apparatus. Thus, the semiconductor device 100b is transferred into the film forming chamber without being exposed to the outside of the apparatus. Alternatively, the etching chamber and the forming film chamber may be the same chamber.

Figure 8:
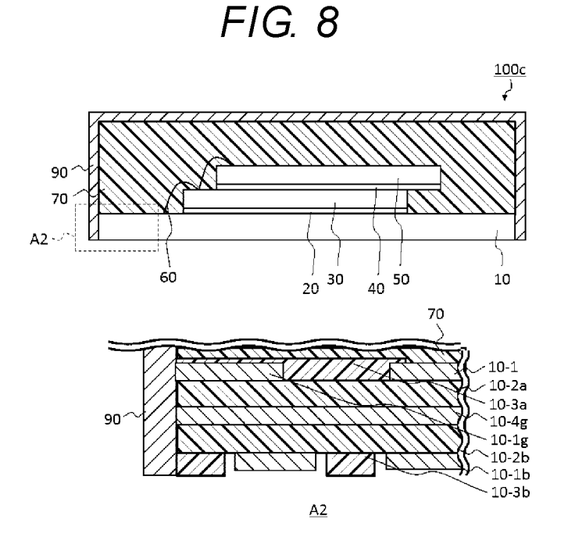
FIG. 8 is a schematic sectional view illustrating a completed device according to the embodiment.

In Step S9, as is illustrated in FIG. 8, a metal layer 90 is formed on the upper surface and the side surface of the sealing layer 70, and the side surface of the wiring substrate 10. The metal layer 90 is formed using, for example, a sputtering method, and copper is used as a material thereof. In addition, the material of the metal layer 90 may include silver, gold, titanium, nickel, iron, chromium, palladium, platinum, aluminum, zinc, vanadium, niobium, tantalum, cobalt, tin, indium, gallium, molybdenum, tungsten, and a stainless steel alloy. In addition, the metal layer 90 can be formed of not only a single film but also a composite film, for example, a composite film which is obtained by combining one or more of these materials with a metal layer 90 layer formed of copper to forma surface protective layer over the copper layer. For example, titanium and a stainless steel alloy can be used as the surface protective layer. Among the composite film, the thickness of the metal layer 90 except for the surface protective layer can be set to be in a range of from 0.1 μm to 20 μm, for example. When the thickness of the metal layer 90 is less than 0.1 μm, a resistance value of the metal layer 90 becomes excessively high, and thus it is not easy to obtain an electromagnetic noise shielding effect therefrom. In addition, when the thickness of the metal layer 90 is greater than 20 μm, a membrane stress between the metal layer 90 and the resin layer 70 can become excessively large, and thus it is likely that the metal layer 90 will peel off. The thickness of the surface protective layer can be set as 0.01 μm to 5 μm. As for the surface protective layer, when the thickness of the protective layer is less than 0.01 μm, the protecting effect is not satisfactory. In addition, when the thickness of the protective layer is greater than 5 μm, the membrane stress becomes excessively large, and thus it is likely that the metal layer 90 will be peeled off the resin layer 70. Moreover, there is an additional problem of an increase in cost of film formation when the metal and protective layers are thick. The metal layer 90 may also be formed using a chemical vapor deposition (CVD) method, a vacuum evaporation method, and an ion plating method.

As described above, the semiconductor device 100 according to the embodiment is formed. In addition, it is not necessary that the surface protective layer is formed of the metal layer, for example, it may be formed of a resin or ceramic, or oxide or nitride of the metal. When the composite film is used as the metal layer 90, the metal layer may be used except for the surface protective layer. In addition, the thickness of the metal layer 90 may be set such that all of the upper surface and the side surface thereof overlying the sealing layer 70 and the side surface of the wiring substrate 10 have the same thickness, or have different thickness. When each thickness is differently set, it is preferable that the metal layer on the side surface of the sealing layer 70 and the side surface of the wiring substrate 10 is thinner than that on the upper surface of the sealing layer 70. The reason for this is that electromagnetic noise is more strongly leaked from the upper surface side of the sealing layer 70.

Relationship Between Etching Amount and Adhesion

Figure 9:
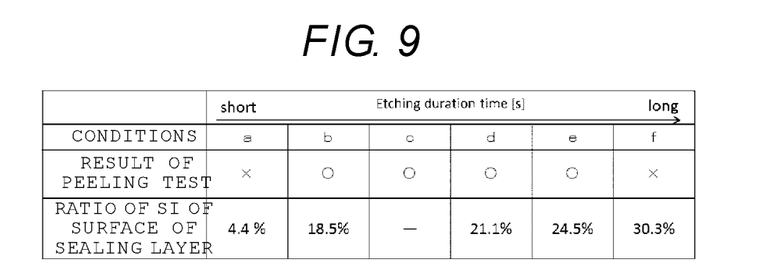
FIG. 9 is a table illustrating a relationship between etching duration time and the result of a peel test.

FIG. 9 is a table illustrating a relationship between etching conditions in Step S8, results of a peel test for the metal layer formed in Step S9, and a percentage of Si on the surface of the sealing layer 70.

Each column in the lateral direction corresponds to each of the etching conditions a to f, that is, an etching duration time. As the condition becomes close to the right side in the table, the etching duration time becomes longer, and the etching amount becomes larger.

"O" or "X" which is indicated in each cell of the table represents the result of peeling test. The peeling test is performed according to a method based on JIS K5600-5-6, in which an adhesive tape is applied to a film layer and then removed, and the surface area of film removed with the tape divided by the total area to which the tape is applied yields a fraction defective percentage. In the method based on JIS K5600-5-6, according to a method for classifying the test result, a fraction defective result which is not greater than 15% corresponds to the classifications of 0 to 2 which are suitable for general purposes, and a case of the fraction defective which is equal to or less than 15% is indicated by "O", and a case of the fraction defective which is greater than 15% is indicated by "X" in FIG. 9. In other words, the condition b to the condition e in FIG. 9 are suitable for the general purposes, and the condition a or the condition f in FIG. 9 is not suitable for the general purposes.

The percentage indicated in each cell of the table represents the percentage of Si (silicon oxide) of the surface of the sealing layer 70 in comparison to the all atomic species on the surface based on exposed area before proceeding Step S9. Specifically, the condition a is 4.4%, the condition b is 18.5%, the condition d is 21.1%, the condition e is 24.5%, and the condition f is 30.3%. The percentage of Si of the surface can be measured through a composition analysis of the surface performed by, for example, XPS.

As illustrated in FIG. 9, the ratio of Si of the surface of the sealing layer 70 is formed in a range of from 18.5% to 24.5%, and thus it is possible to form a semiconductor device including the metal layer 90 with high adhesion.

EFFECT OF EMBODIMENT

According to the embodiment, a series of Steps S7 to S9 are sequentially performed without exposing the semiconductor device to the atmosphere exterior to the process and handling environment. That is, it is possible to manufacture the semiconductor device 100 through a series of Step S7 to Step S9 under an environment in which temperature and humidity are controlled.

Specifically, after the degassing in Step S7, the semiconductor device 100 is not exposed to the atmosphere external to the process device and transfer apparatus. In addition, after the etching in Step S8, the semiconductor device 100 is not exposed to the atmosphere external to the process device and transfer apparatus. Thus it is possible to prevent the sealing layer 70 from absorbing additional moisture. In addition, it is possible to improve the adhesion of the metal layer 90.

Further, according to the embodiment, the metal layer 90 is sputtered in a state where the semiconductor device 100 is arranged on the tray 120 and the carrier 110. The tray 120 and the carrier 110 are in contact with each other in an area immediately below the semiconductor device 100, and thus heat transfer from the semiconductor device 100 is promoted during sputtering, and thus it is possible to suppress the temperature rise of the semiconductor device 100. Additionally, an increased rate of forming film through the sputtering can be realized, and the sputtering time can thus be shortened. That is, it is possible to decrease the cost of manufacturing the semiconductor device 100.

In addition, according to the embodiment, the semiconductor device 100 is baked in Step S3 before a series of processes in Steps S7 to S9. The moisture is evaporated from the sealing layer 70 in advance in the baking step, and thus it is possible to shorten the degassing time in Step S7. In the condition f, the adhesion is deteriorated, which means that the inorganic filler 80 is excessively exposed, and thus the metal layer is removed from the resin 75 together with the filler 80. Accordingly, it is possible to form a metal layer with excellent adhesion by setting a composition ratio of surface Si atoms to be in a range of from 8.5% to 24.5%, It is possible to improve throughputs of the apparatuses in Steps S7 to S9 by shortening the processing time of Step S7. That is, it is possible to manufacture the semiconductor device 100 at lower cost in a shorter time.

Meanwhile, the apparatus (oven) that bakes in Step S5 can process more semiconductor devices 100 at once than the apparatuses that perform a series of processes in Step S7 to S9. The reason for this is that the apparatuses for performing the processes in Step S7 to S9 require a chamber for each step, and a control unit or a transporting unit for performing a series of operations without exposing the semiconductor devices to the environment external of the process chambers and handling device. For this reason, in a case of heating the semiconductor device 100 through the baking, when the baking apparatus of Step S5 is used, the total number of the apparatuses can be reduced. In addition, the apparatuses of in Steps S7 to S9 have complicated configurations, and thus are more expensive than the oven. That is, it is possible to manufacture the semiconductor device 100 at lower cost by reducing the number of the aforementioned apparatuses.

Further, according to the embodiment, it is preferable that the Si atom exposed at the surface of the sealing layer 70 of the semiconductor device 100 is equal to or greater than 18.5%. The reason for this is the high adhesion of the metal layer 90 as illustrated in FIG. 9. That is, it is possible to manufacture the semiconductor device 100 with high reliability.

MODIFICATION EXAMPLE

Figure 10:
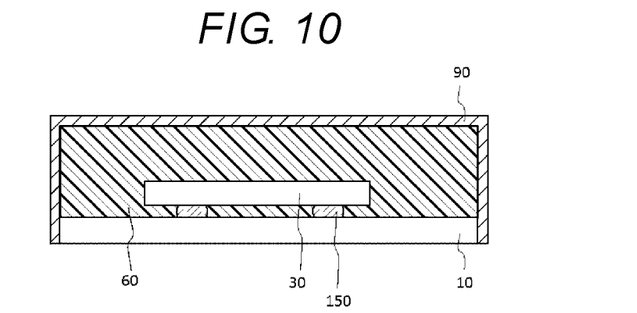
FIG. 10 is a schematic sectional view illustrating a modification example of the device of FIG. 8.

FIG. 10 is a schematic sectional view illustrating Modification example of the embodiment. In the above-described semiconductor device 100, the first semiconductor chip 30 is arranged on the wiring substrate 10 with the first adhesive layer 20 therebetween, and is electrically connected to the wiring substrate 10 by the bonding wire 60. In the modification example depicted in FIG. 10, the first semiconductor chip 30 is connected to the wiring substrate 10 by solder bumps 150. Further physical arrangement methods, and methods for electrically connecting the first semiconductor chip 30 and the wiring substrate 10, may also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   molding a sealing resin layer, including an inorganic filler therein, on a surface of a substrate which includes a plurality of semiconductor elements attached thereto by an adhesive, the substrate further including external input and output terminals disposed on another surface thereof electrically connected to the semiconductor elements;
   cutting the molded substrate so as to expose a conductive body therein having a terminal portion electrically connectable to an external input and output terminal, the external input and output terminal configured to be connectable to a ground potential;
   positioning the cut molded substrates in a tray such that a surface of the sealing resin layer is exposed and an opposed surface of the cut molded substrate faces a surface of the tray;
   sputter-etching, in a sub-atmospheric pressure environment, the exposed surface of the sealing resin layer; and
   sputtering a metal layer over the sealing resin layer and the cut portion of the molded substrate in a sub-atmospheric pressure environment to electrically connect the metal layer to the conductive body on the surface of the cut surface while the cut molded substrate is located on the tray,
   wherein during the sputter-etching, at least a portion of the inorganic filler in the sealing resin is exposed.

2. The method according to claim 1, wherein the inorganic filler is silicon oxide, further comprising
   sputter-etching the resin layer until the percentage of silicon at the surface of the resin layer is a range of from 18.5% to 24.5%.

3. The method according to claim 1,
   wherein the sputtering is performed in a state where a plurality of trays are provided on a carrier, and
   at least a portion of the tray immediately below the substrate is in contact with a portion of the carrier while the sputtering is performed.

4. The method according to claim 1, further comprising:
   heating a plurality of cut substrates provided on the tray, positioned such that at least a portion of the resin layer is exposed and an opposed surface thereof faces the tray, to a temperature in a range of from 150° C. to 260° C. in a sub-atmospheric pressure environment after the cutting and before the sputter-etching; and
   cooling the substrates in a sub-atmospheric environment after the heating and before the sputter-etching,
   wherein the sputter-etching is performed while maintaining the sub-atmospheric pressure environment.

5. The method according to claim 1,
   wherein the metal layer includes a layer containing copper, and
   wherein the sputtering is performed so that the layer containing copper is formed on the cut surface of the substrate at which the conductive body is exposed.

6. The method of claim 1, wherein the inorganic filler is distributed in a matrix of resin.

7. The method of claim 6, wherein the distributed inorganic filler is in the form of particles, and after sputter etching of the resin layer, portions of the particles protrude from the sputter etched surface of the resin layer.

* * * * *